(12) United States Patent
Lee

(10) Patent No.: US 9,023,702 B2
(45) Date of Patent: May 5, 2015

(54) NONVOLATILE MEMORY DEVICE AND METHOD FOR FABRICATING THE SAME

(71) Applicant: SK Hynix Inc., Gyeonggi-do (KR)

(72) Inventor: In-Hey Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/460,954

(22) Filed: Aug. 15, 2014

(65) Prior Publication Data

US 2014/0357031 A1    Dec. 4, 2014

Related U.S. Application Data

(62) Division of application No. 13/717,429, filed on Dec. 17, 2012, now Pat. No. 8,836,013.

(30) Foreign Application Priority Data

Aug. 13, 2012 (KR) ........................ 10-2012-0088485

(51) Int. Cl.
H01L 21/336 (2006.01)
H01L 27/115 (2006.01)
H01L 29/792 (2006.01)
H01L 29/66 (2006.01)
H01L 21/28 (2006.01)
H01L 29/423 (2006.01)
H01L 21/768 (2006.01)

(52) U.S. Cl.
CPC ...... *H01L 27/11582* (2013.01); *H01L 29/7926* (2013.01); *H01L 29/66666* (2013.01); *H01L 21/28* (2013.01); *H01L 29/423* (2013.01); *H01L 21/768* (2013.01); *H01L 21/76879* (2013.01)

(58) Field of Classification Search
CPC .............. H01L 21/28; H01L 21/76879; H01L 27/11582; H01L 29/423; H01L 29/7926
USPC ................................... 438/268; 257/E29.309
See application file for complete search history.

(56) References Cited

U.S. PATENT DOCUMENTS

2011/0002178 A1* 1/2011 Hwang et al. .......... 365/189.011
2012/0068259 A1* 3/2012 Park et al. ...................... 257/329
2012/0146127 A1* 6/2012 Lee et al. ....................... 257/324

* cited by examiner

Primary Examiner — David S Blum
(74) Attorney, Agent, or Firm — IP & T Group LLP

(57) ABSTRACT

A nonvolatile memory device may include a plurality of channel layers protruded substantially perpendicularly over a substrate having a well region, a structure configured to have a plurality of interlayer insulating layers and a plurality of gate electrodes alternately stacked along each of the plurality of channel layers, a plurality of memory layers interposed respectively between each of the plurality of channel layers and each of the plurality of gate electrodes, a source line formed in the substrate between a plurality of the structures, a plurality of source contact plugs placed between the plurality of structures and connected with the source line, and a well pickup contact plug placed between the plurality of structures and connected with the well region.

10 Claims, 7 Drawing Sheets

NONVOLATILE MEMORY DEVICE AND METHOD FOR FABRICATING THE SAME

CROSS-REFERENCE TO RELATED APPLICATIONS

The present application claims priority to U.S. application Ser. No. 13/717429, now U.S. Pat. No. 8,836,013 filed Aug. 13, 2012, and to Korean Patent Application No. 10-2012-0088485, filed on Aug. 13, 2012, which is incorporated herein by reference in its entirety.

BACKGROUND

1. Field

Exemplary embodiments of the present invention relate to a nonvolatile memory device and a method for fabricating the same, and more particularly, to a three-dimensional (3-D) structured nonvolatile memory device in which a plurality of memory cells are stacked in a substantially perpendicular direction over a substrate and a method for fabricating the same.

2. Description of the Related Art

A nonvolatile memory device retains stored data although the supply of power is blocked. A variety of nonvolatile memory devices, such as flash memory, are being widely used.

As the improvement of the degree of integration of two-dimensional (2-D) structured nonvolatile memory devices has reached the limit, there has been proposed a 3-D structured nonvolatile memory device in which a plurality of memory cells is formed along channel layers in a substantially perpendicular direction over a semiconductor substrate. More particularly, the 3-D structured nonvolatile memory device is mainly divided into a structure having a straight-line type channel layer and a structure having a U-shaped channel layer.

A process of fabricating the structure having a straight-line type channel layer is relatively simple and easy, but the structure having a straight-line type channel layer may create some concerns in that source resistance is increased when forming a source line by implanting impurities into a silicon substrate. Accordingly, it is necessary to develop a structure capable of solving above concerns.

SUMMARY

Exemplary embodiments of the present invention are directed to a nonvolatile memory device having reduced source and well pickup contact resistances by forming a plurality of source contact plugs and a well pickup contact plug between structures in each of which gate electrodes are stacked along channel layers protruded perpendicularly over a substrate, and a method for fabricating the same.

In accordance with an embodiment of the present invention, a nonvolatile memory device may include a plurality of channel layers protruded substantially perpendicularly over a substrate having a well region, a structure configured to have a plurality of interlayer insulating layers and a plurality of gate electrodes alternately stacked along each of the plurality of channel layers, a plurality of memory layers interposed respectively between each of the plurality of channel layers and each of the plurality of gate electrodes, a source line formed in the substrate between a plurality of the structures, a plurality of source contact plugs placed between the plurality of structures and connected with the source line, and a well pickup contact plug placed between the plurality of structures and connected with the well region.

In accordance with another embodiment of the present invention, a method for fabricating a nonvolatile memory device may include alternately stacking a plurality of interlayer insulating layers and a plurality of sacrificial layers over a substrate including a well region, forming a channel layer connected with the substrate through the interlayer insulating layers and the sacrificial layers, forming a trench configured to penetrate the plurality of interlayer insulating layers and the plurality of sacrificial layers on both sides of the channel layer and to have the substrate exposed therethrough, removing the sacrificial layers exposed by the trench, sequentially forming memory layers and gate electrodes in spaces where the sacrificial layers are removed, forming a source line in the substrate exposed by the trench, forming an insulating layer that fills the trench, and forming a plurality of source contact plugs connected with the source line and a well pickup contact plug connected with the well region.

DETAILED DESCRIPTION

Figure 1:
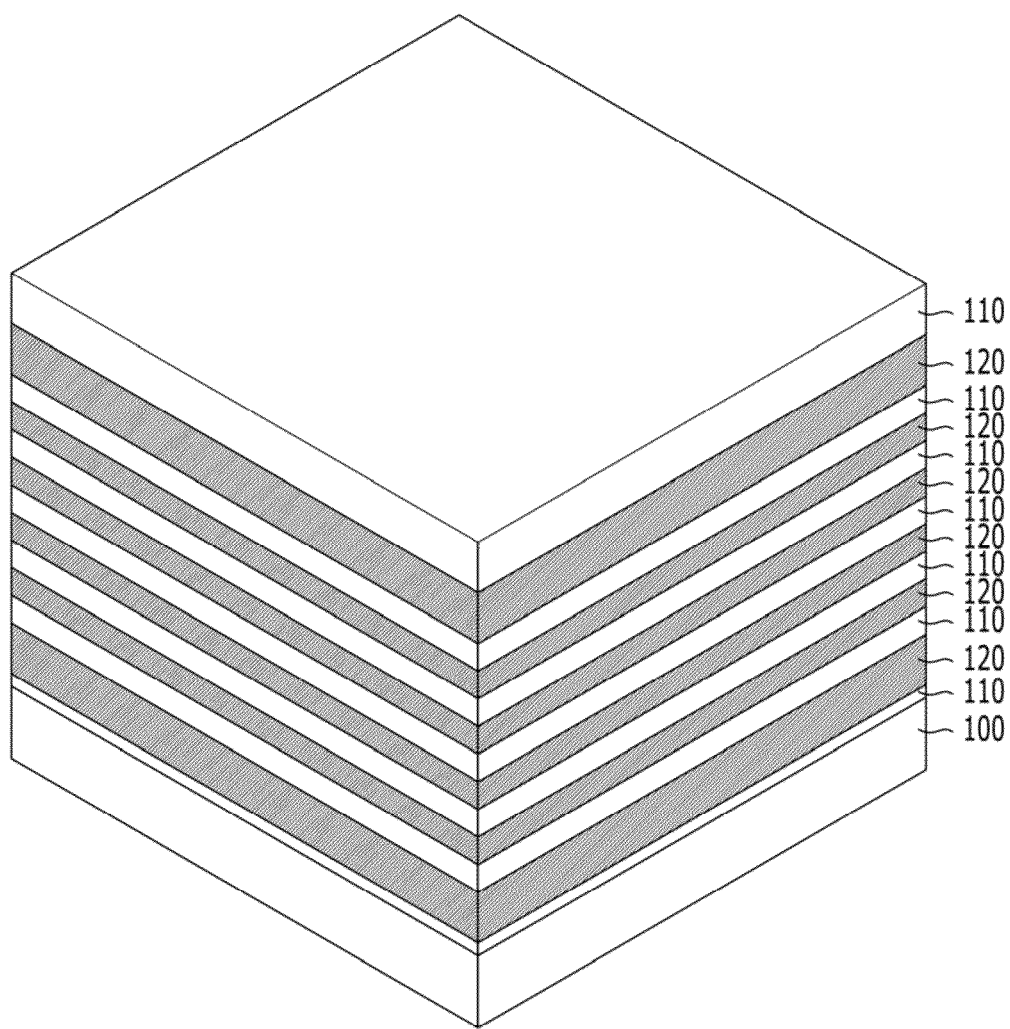
FIGS. 1 to 7 are perspective views illustrating a nonvolatile memory device and a method for fabricating the same in accordance with an embodiment of the present invention.

Exemplary embodiments of the present invention will be described below in more detail with reference to the accompanying drawings, The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

Figure 5:
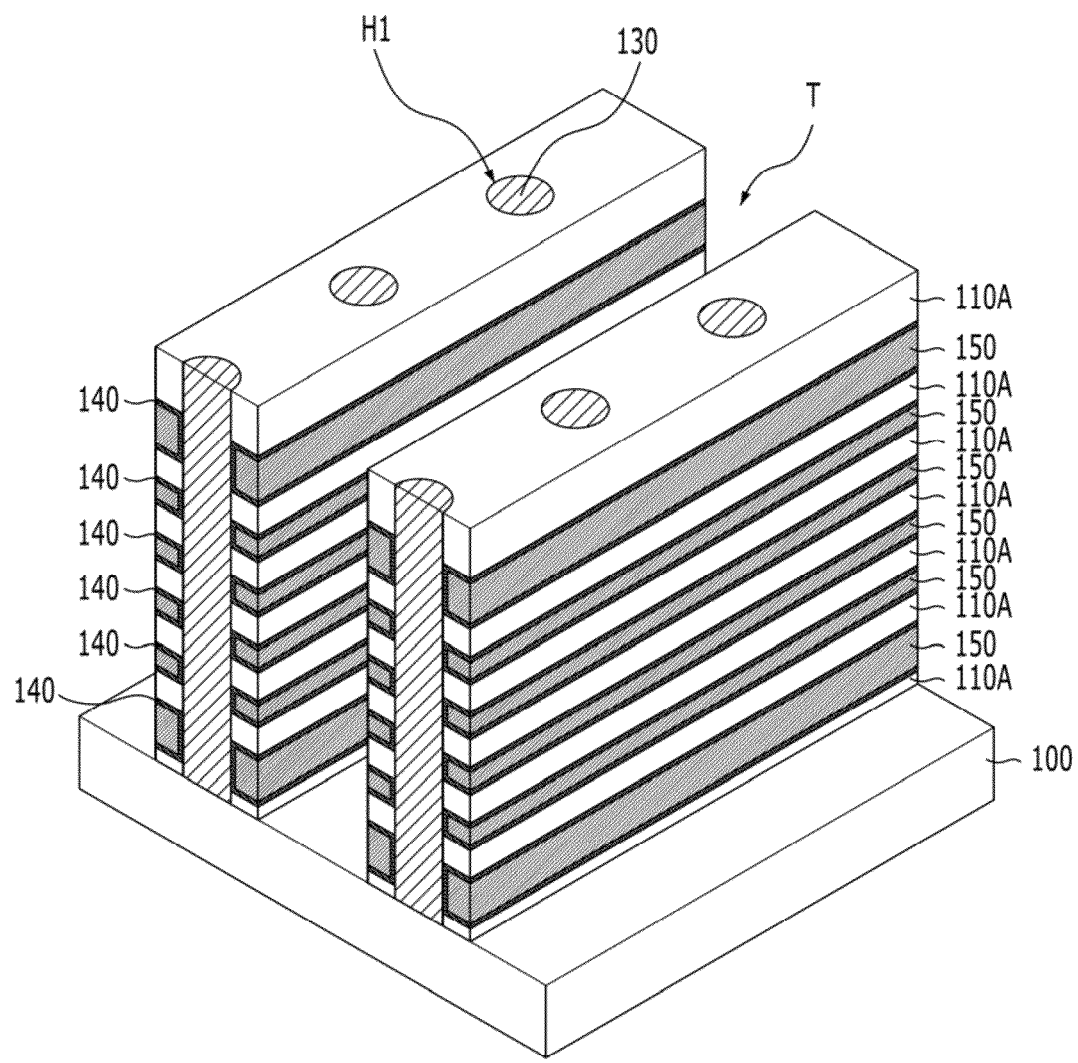
Figure 6:
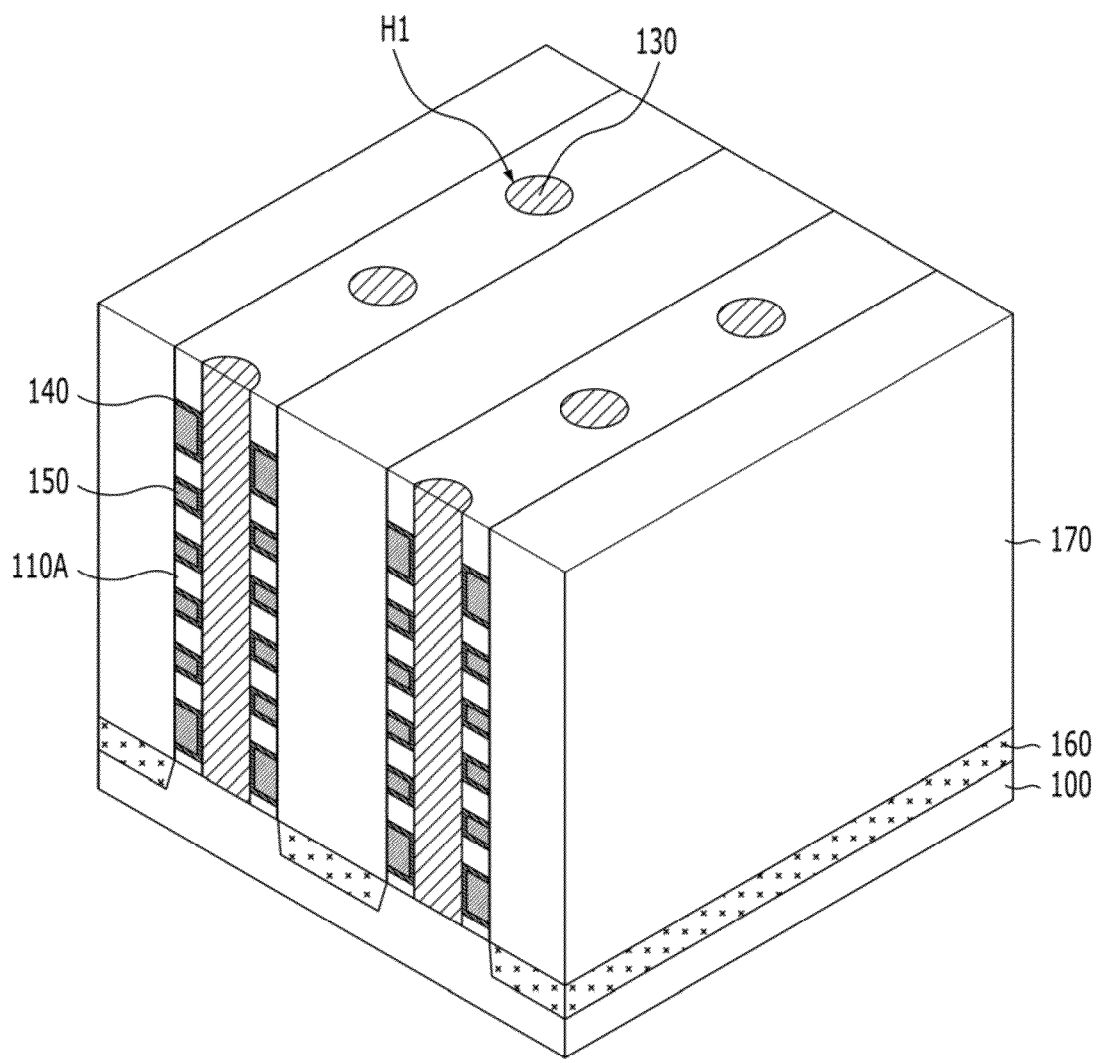
Figure 7:
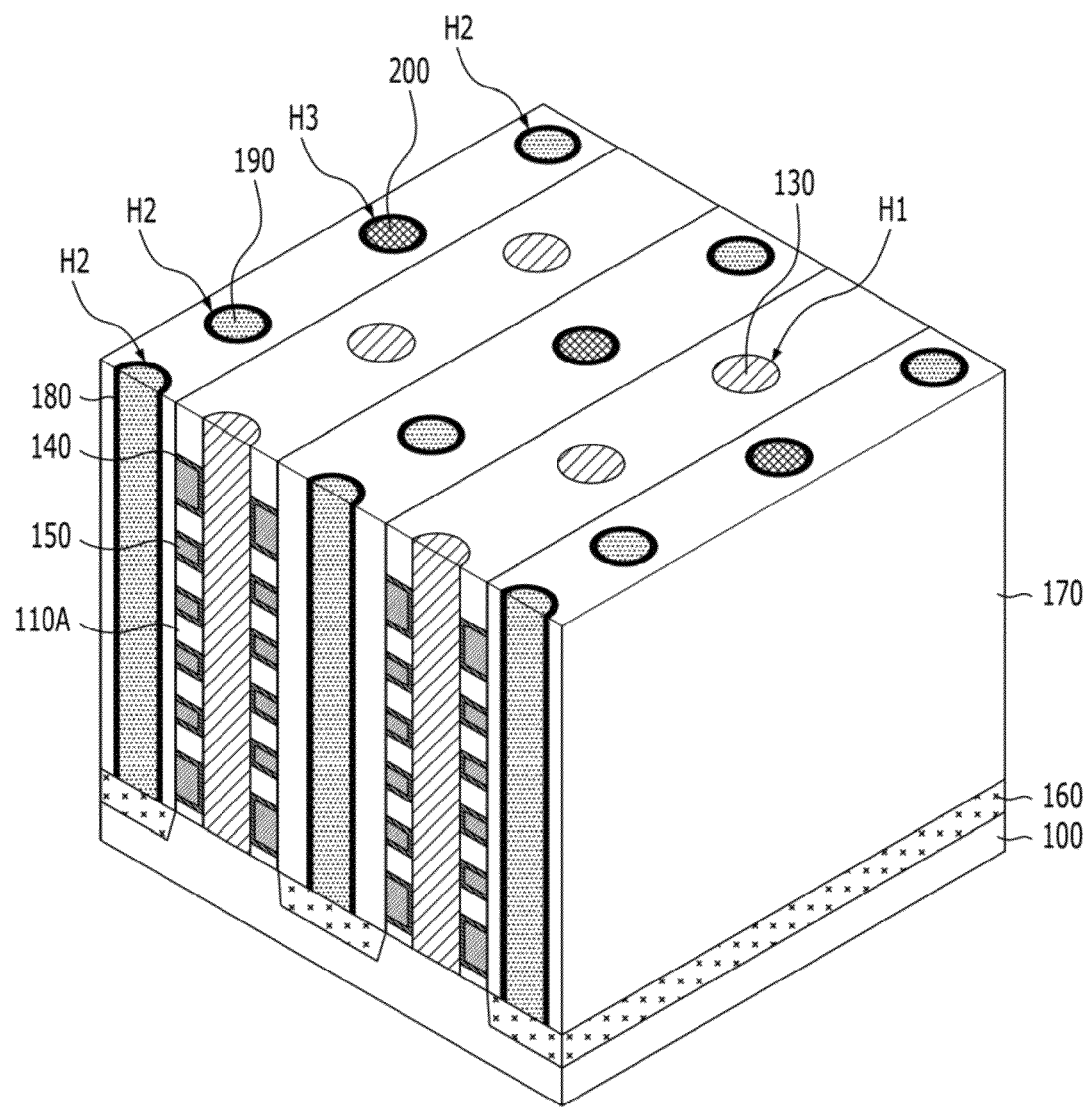

FIGS. 1 to 7 are perspective views illustrating a nonvolatile memory device and a method for fabricating the same in accordance with an embodiment of the present invention. More specifically, FIG. 7 is a perspective view of the nonvolatile memory device in accordance with an embodiment of the present invention, and FIGS. 1 to 6 are perspective views illustrating an example of intermediate process steps for fabricating the nonvolatile memory device of FIG. 7.

Referring to FIG. 1, a plurality of interlayer insulating layers 110 and a plurality of sacrificial layers 120 are alternately stacked over a substrate 100 including specific underlying structures (not shown). The substrate 100 may be a semiconductor substrate, such as single crystalline silicon. The substrate 100 may include a well region having a different conductive type over the substrate 100. A structure in which the plurality of interlayer insulating layers 110 and the plurality of sacrificial layers 120 are alternately stacked is hereinafter referred to as a stack structure, for convenience of description.

The interlayer insulating layers 110 may be disposed at the top and bottom of the stack structure, and the interlayer insulating layers 110 may have an oxide-based material. Furthermore, the sacrificial layers 120 are removed in a subsequent process, thus providing spaces for gate electrodes to be formed. The sacrificial layer 120 may have a material having an etch rate different from an etch rate of the interlayer insulating layer 110, for example, a nitride-based material. In particular, each of the sacrificial layers 120 disposed at the bottom and top of the stack structure may be thicker than the sacrificial layer 120 disposed between the sacrificial layers 120. Meanwhile, this cross section is illustrated as including only 6 sacrificial layers 120, but this is only illustrative. The number of sacrificial layers 120 may be greater than or smaller than 6.

Figure 2:
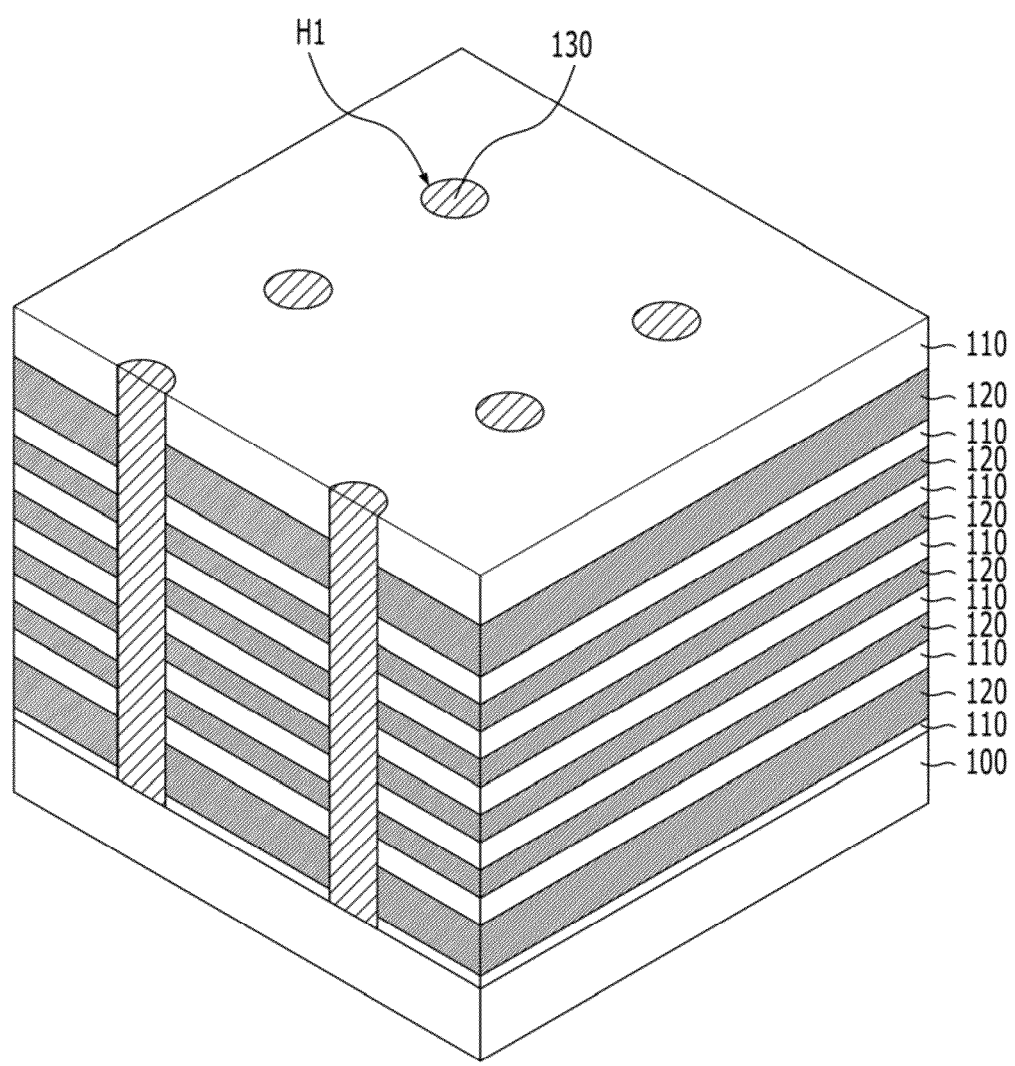

Referring to FIG. 2, a channel hole H1 through which the substrate 100 is exposed is formed by selectively etching the stack structure. The channel hole H1 may have a circular or oval shape when seen from a plane parallel to the substrate 100, and a plurality of channel holes H1 may be arranged in a matrix form. In particular, if a stack structure is formed by alternately stacking an oxide layer and a nitride layer, the stack structure may be easily etched so that it has a vertical etch profile comparable to the existing method of alternately stacking an oxide layer and polysilicon.

A channel layer 130 is formed within the channel hole H1. The channel layer 130 may have a bottom connected to the substrate 100, and the channel layer 130 may be formed by filling the channel hole H1 with a semiconductor material, such as silicon (Si). In order to form the channel layer 130, an epitaxial growth process, such as laser-induced epitaxial growth (LEG), or a deposition process may be performed. Meanwhile, in the present embodiment, the channel layer 130 is illustrated as being formed to a thickness that fully fills the channel hole H1, but the present invention is not limited thereto. In another embodiment, the channel layer 130 may be formed to a thickness that does not fully fill the channel hole H1.

Figure 3:
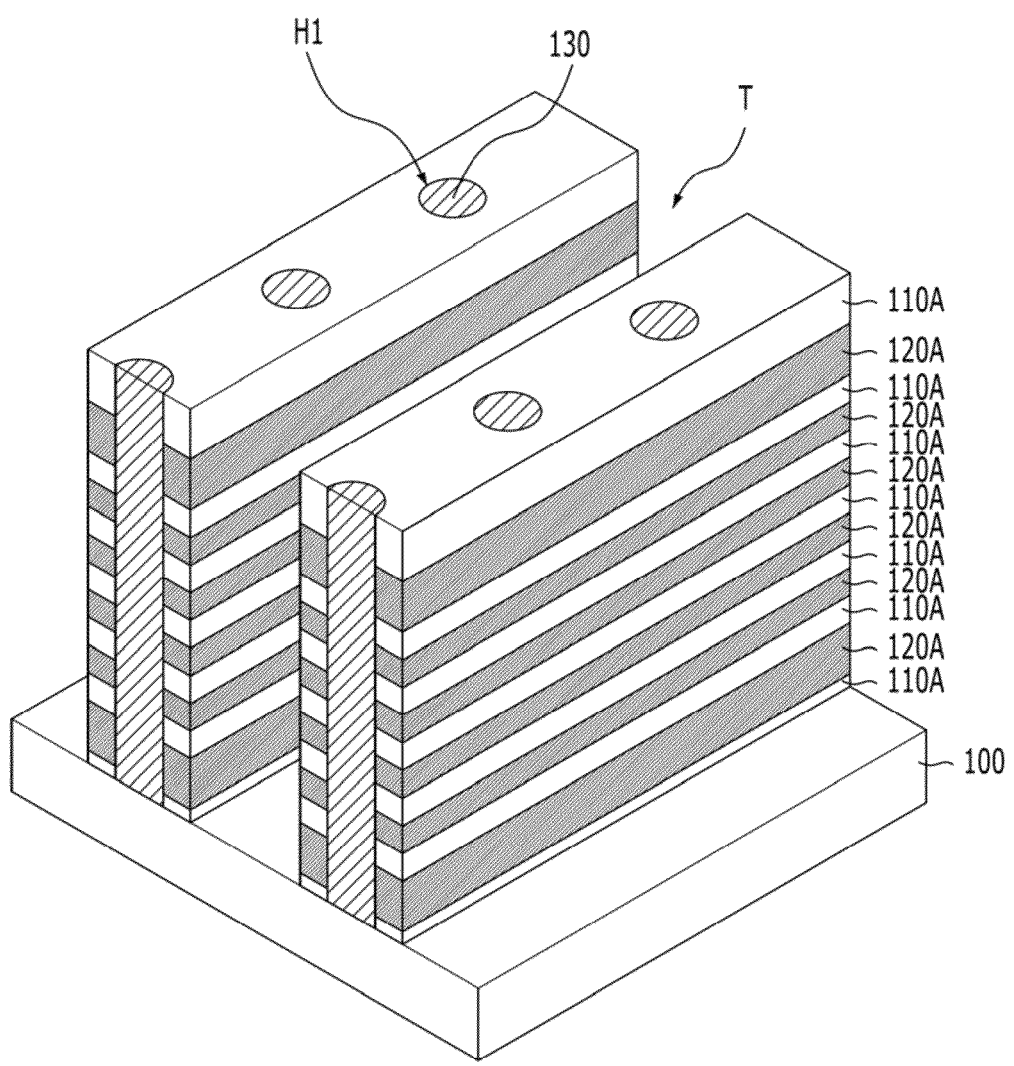

Referring to FIG. 3, a trench T through which the substrate 100 on both sides of the channel layer 130 is exposed is formed by selectively etching the stack structure. A plurality of the trenches T that extend in one direction may be arranged in parallel. The trenches T may separate the interlayer insulating layers 110 and the sacrificial layers 120 in a line form, Meanwhile, the interlayer insulating layers 110 and the sacrificial layers 120 separated as a result of this process are referred to as interlayer insulating layer patterns 110A and sacrificial layer patterns 120A.

Figure 4:
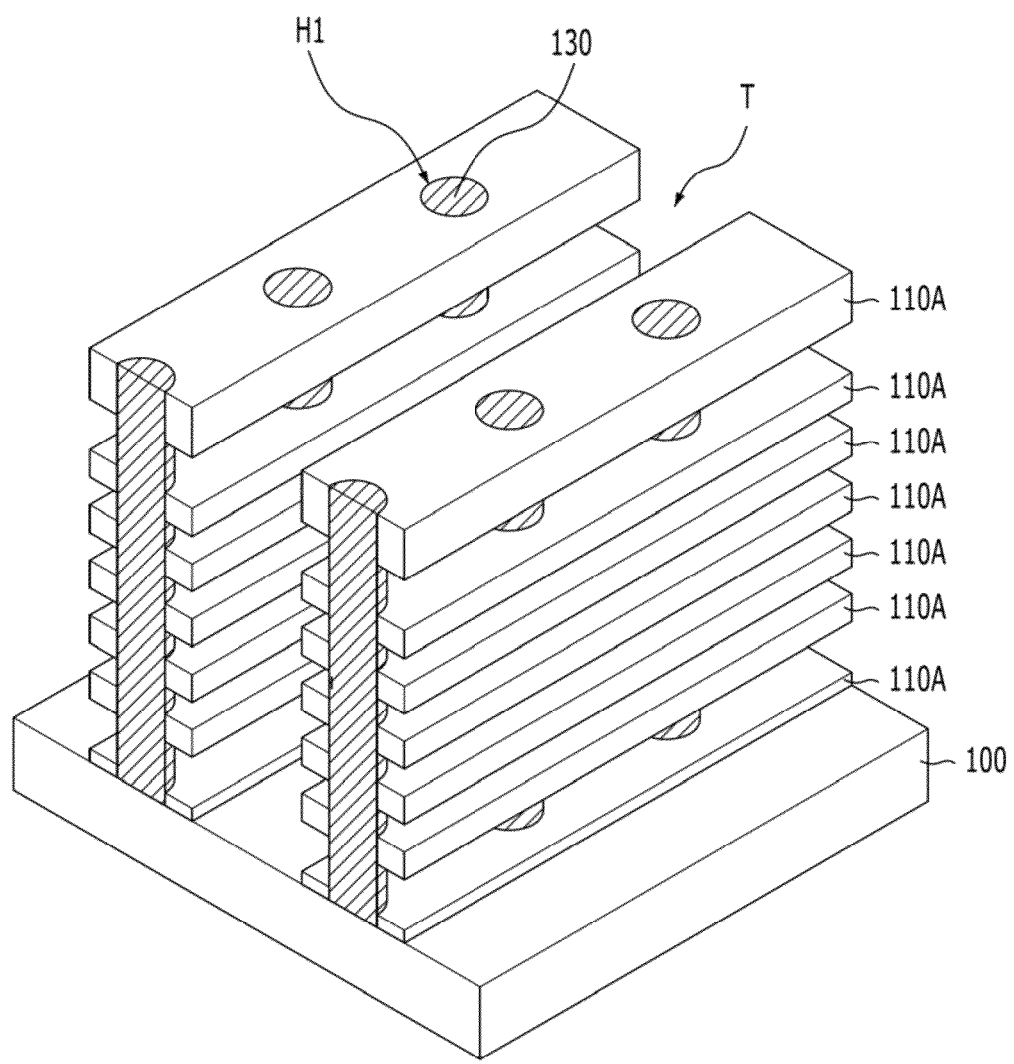

Referring to FIG. 4, the sacrificial layer patterns 120A exposed by the trench T are removed. In order to remove the sacrificial layer patterns 120A, a wet etch process of a dip-out method using an etch selectivity with the interlayer insulating layer patterns 110A may be performed. Meanwhile, as a result of this process, part of the side of the channel layer 130 is exposed.

Referring to FIG. 5, memory layers 140 are formed on the inner walls of the spaces from which the sacrificial layer patterns 120A are removed through the trench T. Each of the memory layers 140 may be formed by sequentially depositing a tunnel insulating layer charge trap layer, and a charge blocking layer.

Here, the tunnel insulating layer is for charge tunneling and may include an oxide layer, for example. The charge trap layer functions to store data by trapping charges, and the charge trap layer may include a nitride layer, for example. The charge blocking layer functions to preclude charges within the charge trap layer from moving externally, and the charge blocking layer may include an oxide layer, for example. That is, the memory layers 140 may have a triple structure of oxide-nitride-oxide (ONO).

Next, gate electrodes 150 are formed in the respective spaces from which the sacrificial layer patterns 120A are removed. The gate electrodes 150 may be formed by the following process. First, a conductive layer (not shown) for the gate electrodes is formed to a thickness that fills the spaces from which the sacrificial layer patterns 120A are removed by depositing a conductive material, for example, metal or metal nitride, on the memory layers 140 using a chemical vapor deposition (CVD) or atomic layer deposition (ALD) method. The conductive layer for the gate electrodes is etched until the sides of the interlayer insulating layer patterns 110A are exposed, with the result that the conductive layers are separated for each layer and the gate electrode 150 is formed between the interlayer insulating layer patterns 110A. Meanwhile as a result of this process, the memory layers 140 may also be separated for each layer.

Referring to FIG. 6, a source line 160 is formed in the substrate 100 exposed by the trench T. The source line 160 may be formed by doping impurities into the substrate 100 using an ion implantation, and the source line 160 may extend in the same direction as the gate electrodes 150.

Next, an insulating layer 170 to fill the trench T is formed. The insulating layer 170 may be formed by depositing an oxide- or nitride-based material to a thickness that fills the trench T and then performing a polishing process, such as chemical mechanical polishing (CMP), until a top surface of the channel layer 130 is exposed.

Referring to FIG. 7, a source contact hole H2 through which the source line 160 is exposed is formed by selectively etching the insulating layer 170. The source contact hole H2 may have a circular or oval shape when seen from a plane parallel to the substrate 100, and a plurality of the source contact holes H2 may be arranged in a line along the source line 160.

A well pickup contact hole H3 through which a specific region of the substrate 100, for example, a well region (not shown) is exposed is formed by selectively etching the insulating layer 170 and the source line 160. The well pickup contact hole H3 may have a circular or oval shape when seen from a plane parallel to the substrate 100. The well pickup contact hole H3 may be formed between a plurality of the source contact holes H2. Next, impurities may be doped into the well region, exposed by the well pickup contact hole H3, through ion implantation so that a surface of the well region has a different conductive type from a lower part of the well region.

Next, a spacer layer 180 is formed on the sidewalls of the source contact hole H2 and the well pickup contact hole H3. The spacer layer 180 may prevent a short with the gate electrodes 150, and the spacer layer 180 may be formed by depositing a nitride-based material for example. Subsequently, a source contact plug 190 that fills the source contact hole H2 and a well pickup contact plug 200 that fills the well pickup contact hole H3 are formed.

The source contact plug 190 and the well pickup contact plug 200 may be connected with the source line 160 and the well region of the substrate 100, respectively, The source contact plug 190 and the well pickup contact plug 200 may be formed by filling the source contact hole H2 and the well pickup contact hole H3 with a conductive material. For example, the source contact plug 190 and the well pickup contact plug 200 may be formed in such a manner that a barrier metal layer may be formed by depositing titanium (Ti) or titanium nitride (TiN) on the inner walls of the source contact hole H2 and the well pickup contact hole H3 and metal, such as tungsten (W), may then be deposited.

In accordance with the above-described fabrication method, the nonvolatile memory device in accordance with an embodiment of the present invention, such as that shown in FIG. 7, is fabricated.

As shown in FIG. 7, the nonvolatile memory device in accordance with the embodiment of the present invention may include the channel layer 130 protruded perpendicularly over the substrate 100 having the well region, the stack structure configured to have the plurality of interlayer insulating layer patterns 110A and the plurality of gate electrodes 150 alternately stacked along the channel layer 130, the memory layers 140 disposed between the channel layer 130 and the gate electrodes 150 and between the interlayer insulating patterns 110A and the gate electrodes 150, the source line 160 formed in the substrate 100 between the stack structures, the plurality of source contact plugs 190 placed between the stack structures and connected with the source line 160, the well pickup contact plug 200 placed between the stack structures and connected with the well region, and the spacer layer 180 configured to surround the sides of the source contact plugs 190 and the well pickup contact plug 200.

The source contact plugs 190 and the well pickup contact plug 200 may extend in substantially the same direction as the channel layers 130, and the well pickup contact plug 200 may be placed between the plurality of source contact plugs 190. Meanwhile, the gate electrodes 150 may extend in one direction while surrounding the side of the channel layer 130. In particular, the gate electrodes 150 disposed at the bottom and top of the stack structure may form select transistors, and the gate electrodes 150 disposed between the gate electrodes 150 disposed at the bottom and top of the stack structure may form memory cell transistors, respectively.

In accordance with the nonvolatile memory device and the method for fabricating the same in accordance with the embodiment of the present invention, the plurality of source contact plugs and the well pickup contact plug are formed between the stack structures in each of which the gate electrodes are stacked along the channel layers protruded perpendicularly over the substrate. Accordingly, source and well pickup contact resistance may be reduced, and a chip size may also be reduced.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a nonvolatile memory device, comprising:

alternately stacking a plurality of interlayer insulating layers and a plurality of sacrificial layers over a substrate including a well region;
   forming a channel layer connected with the substrate through the interlayer insulating layers and the sacrificial layers;
   forming a trench configured to penetrate the plurality of interlayer insulating layers and the plurality of sacrificial layers on both sides of the channel layer and to have the substrate exposed therethrough;
   removing the sacrificial layers exposed by the trench;
   sequentially forming memory layers and gate electrodes in spaces where the sacrificial layers are removed;
   forming a source line in the substrate exposed by the trench;
   forming an insulating layer that fills the trench; and
   forming a plurality of source contact plugs connected with the source line and a well pickup contact plug connected with the well region.

2. The method of claim 1, wherein the well pickup contact plug is formed between the plurality of source contact plugs.

3. The method of claim 1, wherein the plurality of sacrificial layers comprise a material having an etch rate different from an etch rate of the interlayer insulating layers.

4. The method of claim 1, wherein the forming of the channel layer comprises:

forming a channel hole through which the substrate is exposed by selectively etching the plurality of interlayer insulating layers and the plurality of sacrificial layers; and
   filling the channel hole with a semiconductor material.

5. The method of claim 1, wherein the channel layer is formed by an epitaxial growth process.

6. The method of claim 1, wherein the memory layers are formed on inner walls of spaces where the plurality of sacrificial layers are removed.

7. The method of claim 1, wherein the source line is formed by doping impurities into the substrate.

8. The method of claim 1, wherein the forming of the source contact plugs and the well pickup contact plug comprises:

forming source contact holes through which the source line is exposed by selectively etching the insulating layer;
   forming a well pickup contact hole through which the well region is exposed by selectively etching the insulating layer and the source line; and
   filling the source contact holes and the well pickup contact hole with a conductive material.

9. The method of claim 8, further comprising doping impurities into the well region exposed by the well pickup contact hole, after forming the well pickup contact hole.

10. The method of claim 8, further comprising forming a spacer layer on sidewalls of the source contact holes and the well pickup contact hole, after forming the source contact holes and the well pickup contact hole.

* * * * *